US009911369B2

(12) United States Patent
Kim et al.

(10) Patent No.: US 9,911,369 B2
(45) Date of Patent: Mar. 6, 2018

(54) ROLLABLE DISPLAY DEVICE

(71) Applicant: Samsung Electronics Co., Ltd, Gyeonggi-do (KR)

(72) Inventors: Jinwook Kim, Gyeongsangbuk-do (KR); Sangmin Hyun, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/167,843

(22) Filed: May 27, 2016

(65) Prior Publication Data

US 2016/0353588 A1 Dec. 1, 2016

(30) Foreign Application Priority Data

May 29, 2015 (KR) ........................ 10-2015-0076119

(51) Int. Cl.

| | |
|---|---|
| ***H05K 5/00*** | (2006.01) |
| ***G09F 15/00*** | (2006.01) |
| ***G09F 9/30*** | (2006.01) |
| ***H02P 29/00*** | (2016.01) |

(52) U.S. Cl.

CPC .......... *G09F 9/301* (2013.01); *G09F 15/0025* (2013.01); *H02P 29/00* (2013.01); *H05K 5/0017* (2013.01)

(58) Field of Classification Search

CPC .... G06F 1/1652; G06F 1/1641; G06F 1/1601; G06F 1/1613; G06F 1/1618; G06F 1/1626; G06F 1/163; G06F 1/1633; G06F 1/1681; G06F 1/1677; G06F 1/1643; G06F 1/1684; G06F 1/181; G06F 1/1616; G06F 1/1656; G06F 1/187; G06F 1/16; G06F 3/04866; G09F 9/301; G09F 7/10; G09F 15/0025; H05K 1/028; H05K 2201/051; H05K 5/0017; H05K 7/1427; H05K 1/147; H05K 5/03; G09G 5/30; G09G 5/32; G09G 5/373; G09G 5/34; G09G 5/14; H02P 29/00

USPC .... 361/679.01, 749, 679.26, 679.27, 679.55, 361/679.02; 345/173

See application file for complete search history.

(56) References Cited

U.S. PATENT DOCUMENTS

| | | | | |
|---|---|---|---|---|
| 8,096,068 B2 | 1/2012 | Van Rens | | |
| 2013/0021762 A1 | 1/2013 | van Dijk | | |
| 2014/0166992 A1 | 6/2014 | Hack et al. | | |
| 2014/0247544 A1* | 9/2014 | Ryu | G09F 11/18 | 361/679.01 |
| 2015/0009636 A1* | 1/2015 | Jeong | B65H 18/10 | 361/749 |

FOREIGN PATENT DOCUMENTS

JP 2010078684 * 4/2010

* cited by examiner

*Primary Examiner* — Anthony Haughton
*Assistant Examiner* — Ingrid Wright

(57) ABSTRACT

A rollable display device is provided. The rollable display device includes: a flexible screen display which is rolled or unrolled on both sides; at least one pair of rollable driving units where each side of the flexible screen display is rolled into or unrolled from one of the pair of rollable driving units; a link driving unit for supporting the rollable driving units to move the sides of the flexible screen display and to roll or unroll the flexible screen display; and a controller for controlling operations of the rollable driving units and the link driving unit.

15 Claims, 12 Drawing Sheets

ROLLABLE DISPLAY DEVICE

CROSS-REFERENCE TO RELATED APPLICATION(S) AND CLAIM OF PRIORITY

The present application is related to and claims benefit under 35 U.S.C. § 119(a) of Korean patent application filed on May 29, 2015 in the Korean Intellectual Property Office and assigned Serial number 10-2015-0076119, the entire disclosure of which is hereby incorporated by reference.

TECHNICAL FIELD

Various embodiments of the present disclosure relate to a rollable display device for unfolding and folding of a flexible screen.

BACKGROUND

In order to improve immersion with a wider field of view, existing flexible display devices have been implemented in such a way to employ a fixed curved display structure which has a curved screen whose screen is fixed or a variable flexible screen which is bent or unbent; or a structure with a protection unit and a driving unit for varying the radius R of the flexible display screen.

As such, conventional flexible display devices have been manufactured to be fixed in screen-size or curved screen angle or to allow a particular portion of the screen to be bent or unbent. The conventional flexible display devices, however, are not designed to maximize an advantage of flexibility.

To resolve this problem, a rollable display device having a flexible screen display has been developed. A flexible screen display can be rolled up into a scroll which is small in size or unrolled to a large screen, thereby providing the display with various screen ratios.

Since devices with a rollable display (rollable display devices) can display a screen in various sizes to meet a user's needs or optimize display of specific types of content, they are becoming more popular.

However, when rollable display devices are implemented to have a relatively large size, they need to provide higher quality display and have high endurance and safety characteristics.

SUMMARY

To address the above-discussed deficiencies, it is a primary object to provide a rollable display device of a foldable type configured to provide a flexible screen display allowing for various screen sizes by unfolding or folding one or both sides thereof.

Another aspect of the present disclosure provides a rollable display device configured to have a driving structure for unfolding and folding a flexible screen display on both sides and a structure for protecting and maintaining the flatness of the flexible screen display to provide a clear screen for driving the rollable display device.

In accordance with an aspect of the present disclosure, a rollable display device comprises: a flexible screen display configured to be rolled or unrolled on both sides; at least one pair of rollable driving units where the sides of the flexible screen display are rolled into and unrolled therefrom; a link driving unit for supporting the rollable driving units when rolling or unrolling the sides of the flexible screen display;

and a controller for controlling the operations of the rollable driving units and the link driving unit.

The link driving unit may comprise a support vertically installed to the flexible screen display; first and second links which are folded into and unfolded from both sides of the support; and a driving motor for producing a torque sufficient to fold or unfold the first and second links.

The first and second links may be folded or unfolded with respect to hinges; and each of the first and second links comprises a fixed end affixed to a lower portion of the rollable driving units, and a free end movably coupled to an upper portion of the rollable driving units.

The first and second links may be configured in such a way that one end is fixed and is affixed to a lower portion of the support and the other end moves up and down along a screw bar attached to an upper portion of the support.

The screw bar may rotate in forward and backward directions according to the driving motor installed to the support; and one end of each of the first and second links move up and down along the screw bar, and thus folding the rollable display device.

In one embodiment of the present disclosure, the rollable driving unit may be a double cylindrical structure.

In another embodiment of the present disclosure, the rollable driving unit may comprise a rolling motor; an external cylindrical unit for rolling or unrolling the flexible screen display according to operations of the rolling motor; a pair of internal cylindrical units which hold ends of the flexible screen display and are inserted into the external cylindrical unit; and a vertical movement adjusting unit for moving the external cylindrical unit and internal cylindrical units up and down at a constant interval and maintaining the movement and the interval.

The vertical movement adjusting unit may comprise a thread protrusion on which a helical structure is formed and which rotates according to the rotation of the external cylindrical unit; and a protrusion integrally formed at a lower portion of the internal cylindrical unit, to be coupled with the helical structure of the thread protrusion.

In an embodiment of the present disclosure, the vertical movement adjusting unit may comprise a protrusion formed at the lower center of the internal cylindrical unit; and an elastic spring inserted into the protrusion.

In another embodiment of the present disclosure, the vertical movement adjusting unit may comprise first and second electromagnets installed between the internal cylindrical unit and the external cylindrical unit; and a sensor for detecting an interval between the external cylindrical unit and the internal cylindrical unit according to a variation of the screen of the flexible screen display, for example caused by gravity.

The controller may control, based on the detected signal, the first and second electromagnets to change their poles and thus control the interval between the external cylindrical unit and the internal cylindrical unit.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
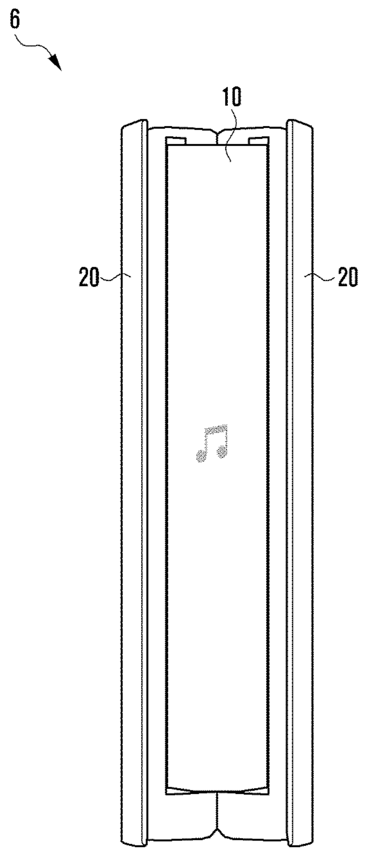
FIG. 1 illustrates a front view of a rollable display device with a screen display in a folded position according to various embodiments of the present disclosure.

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged display device. Hereinafter, the present disclosure will be described with reference to the accompanying drawings. Although specific embodiments are illustrated in the drawings and related detailed descriptions are discussed in the present specification, the present disclosure may have various modifications and several embodiments. However, various embodiments of the present disclosure are not limited to a specific implementation form and it should be understood that the present disclosure includes all changes and/or equivalents and substitutes included in the spirit and scope of various embodiments of the present disclosure. In connection with descriptions of the drawings, similar components are designated by the same reference numeral.

Figure 2:
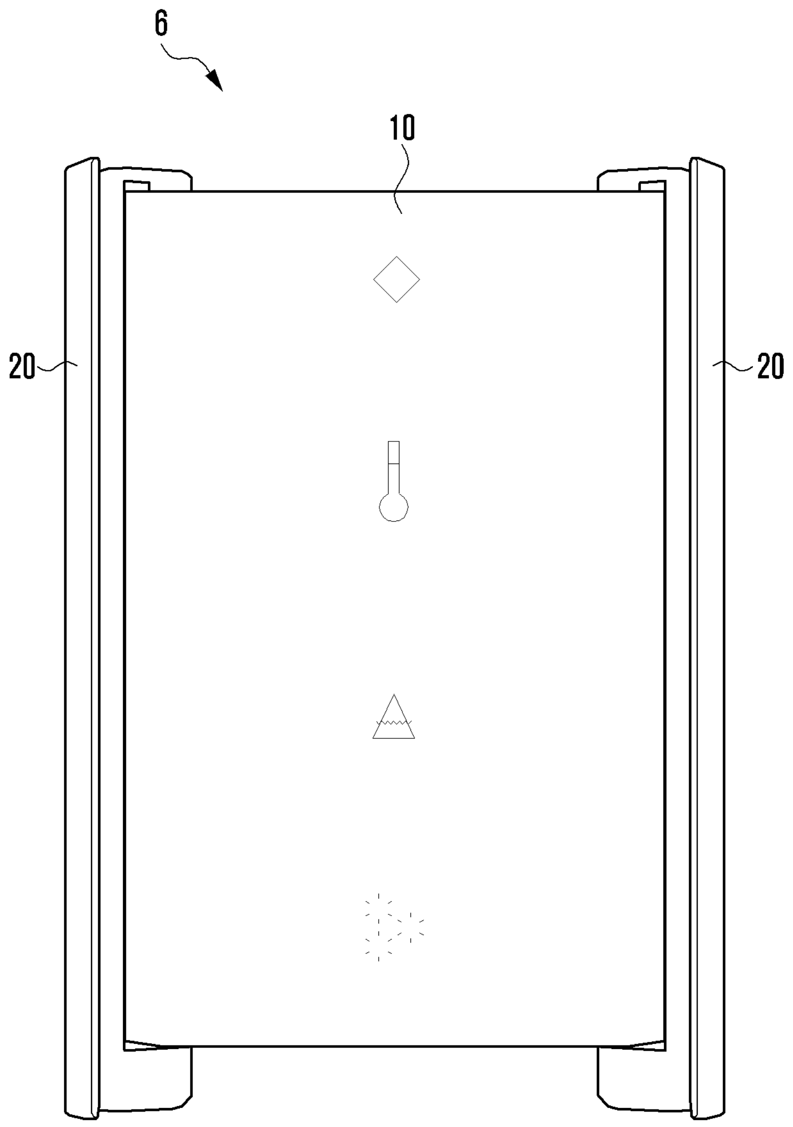
FIG. 2 illustrates a front view of a rollable display device with a screen display in a partially unfolded position according to various embodiments of the present disclosure.
Figure 3:
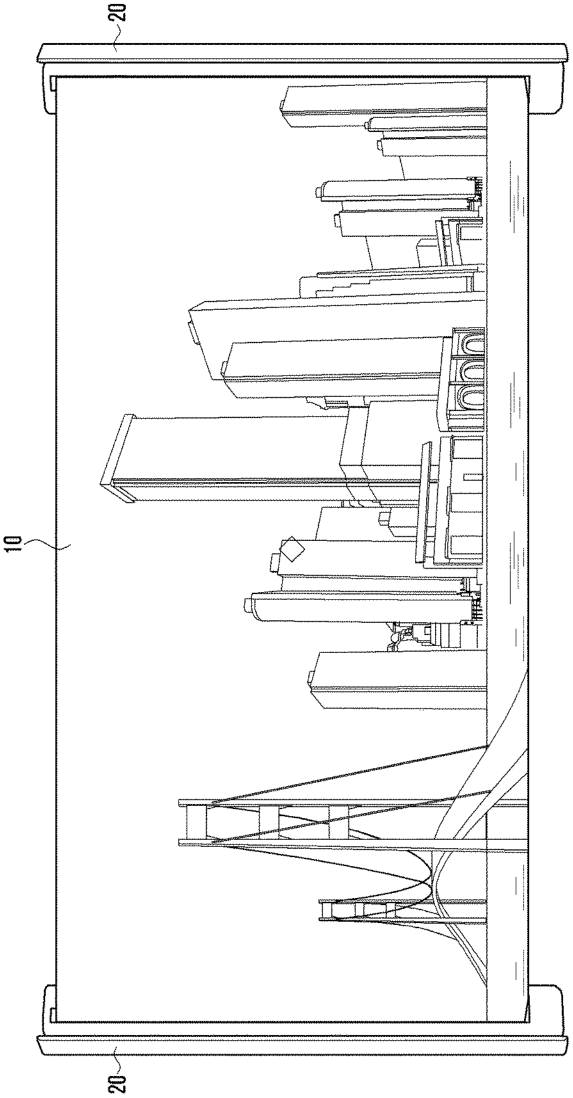
FIG. 3 illustrates a front view of a rollable display device with a screen display in a fully unfolded position according to various embodiments of the present disclosure.
Figure 4:
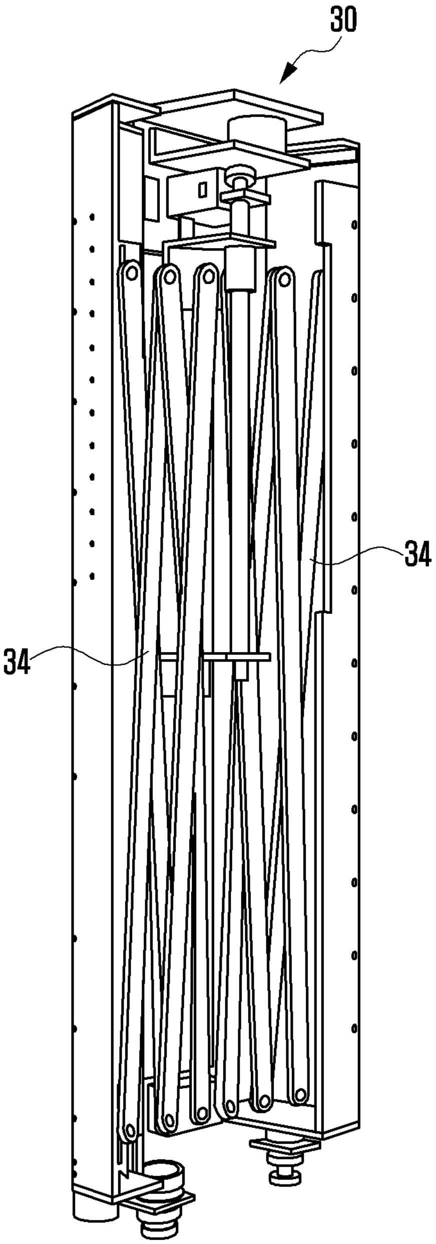
FIG. 4 illustrates a rear perspective view of a rollable display device according to various embodiments of the present disclosure.
Figure 5:
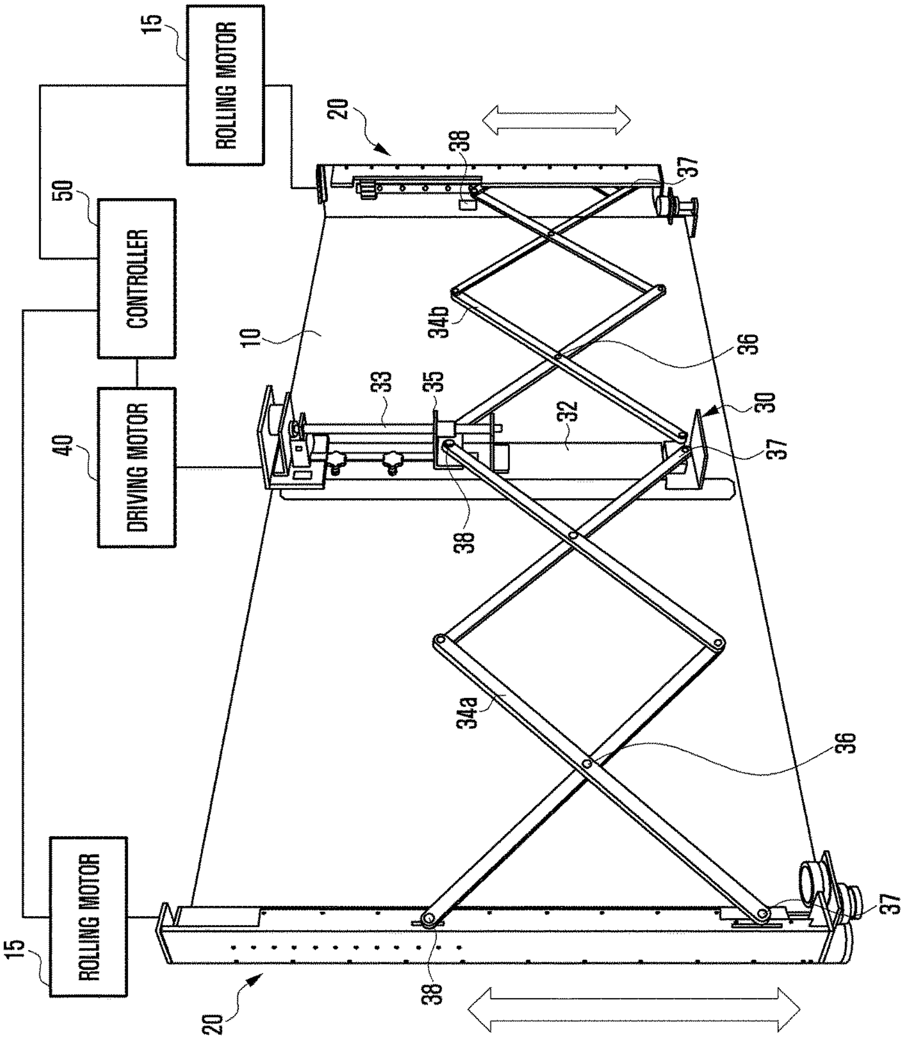
FIG. 5 illustrates a perspective view of a link driving unit according to various embodiments of the present disclosure.

FIG. 1 illustrates a front view of a rollable display device with a screen display in a folded position according to various embodiments of the present disclosure; FIG. 2 illustrates a front view of a rollable display device with a screen display in a partially unfolded position according to various embodiments of the present disclosure; FIG. 3 illustrates a front view of a rollable display device with a screen display in a fully unfolded position according to various embodiments of the present disclosure; FIG. 4 illustrates a rear perspective view of a rollable display device according to various embodiments of the present disclosure; and FIG. 5 illustrates a front perspective view of a link driving unit according to various embodiments of the present disclosure. Referring to FIGS. 1 to 5, the rollable display device 6 includes: a flexible screen display 10 with a relatively large rectangular screen which is configured to be rolled and unrolled on both sides; a pair of rollable driving units 20 that the individual sides of the flexible screen display 10 are rolled into and unrolled therefrom, respectively; a link driving unit 30 for supporting the rollable driving units 20 as the rollable driving units move the sides of the screen display in opposite directions to roll or unroll the flexible screen display 10 of the rollable display device 6; and a controller 50 for controlling the operations of the rollable driving units 20 and the link driving unit 30.

In various embodiments, the flexible display unit 10 is capable of displaying a screen of a mobile device or an audio system according to user experience design or UX, thereby automatically allowing user to view the screen. Although it is not shown, the rollable display device 6 may further include a cover configured to open and close for protecting the flexible screen display 10 installed thereto.

The link driving unit 30 is configured to include: a support 32 vertically installed to the back and at the center of the flexible screen display 10; first and second links 34*a* and 34*b* which are configured to fold and unfold the respective sides of the screen in opposing directions from the support 32; and a driving motor 40 for producing a torque to fold and unfold the first and second links 34*a* and 34*b*, respectively.

The first and second links 34*a* and 34*b*, respectively, are folded or unfolded with respect to the hinges 36. Each of the first and second links is configured in such a way that one end serves as a fixed end 37 affixed to a lower portion of the rollable driving units 20; and the other end serves as a free end 38 movably coupled to an upper portion of the rollable driving units 20. Similarly, each of the first and second links is configured in such a way that: one end is affixed to a lower portion of the support 32; and the other end moves up and down along a screw bar 33 attached to an upper portion of the support 32. In one embodiment, a bracket 35 is installed to the screw bar 33. The other end of each of the first and second links 34 is attached to the bracket 35.

Although the embodiment as depicted in FIG. 5 illustrates the up and down movement of the first and second links 34*a* and 34*b*, respectively, by the up and down movement of the bracket 35 which is performed by driving the screw bar 33, it should be understood that the present disclosure is not limited thereto.

The driving motor 40 may be installed to the support 32 and is configured to rotate the screw bar 33 in a forward or reverse direction as needed. When the driving motor 40 rotates the screw bar 33 in a forward or reverse direction, the other ends of the first and second links move up or down along the screw bar 33 and the first and second links are folded or unfolded accordingly. In that case, the flexible screen display 10 is rolled or unrolled on both sides. For example, when the ends of the first and second links 34*a* and 34*b*, respectively, are adjacent to each other, the rollable display device 6 is in a folded position and the flexible screen display 10 is rolled up as close as possible, as depicted in FIG. 1. In contrast, when the ends of the first and second links 34*a* and 34*b*, respectively, are spaced apart from each other, the rollable display device 6 is in an unfolded position as in FIG. 2 or 3, and the flexible screen display 10 is partially or fully unfolded.

Figure 6:
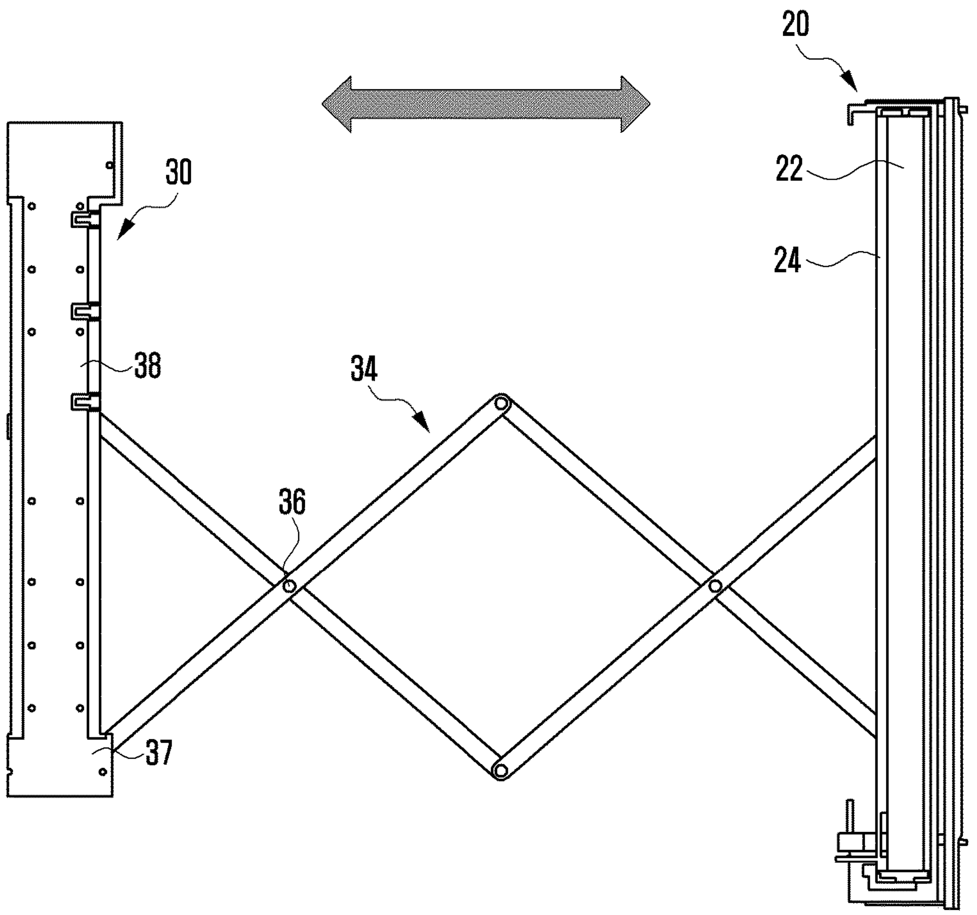
FIG. 6 illustrates a front view of a rollable display device with a flexible screen display with one side unfolded from a rollable driving unit that is operated by a centrally positioned link driving unit according to an embodiment of the present disclosure.
Figure 7:
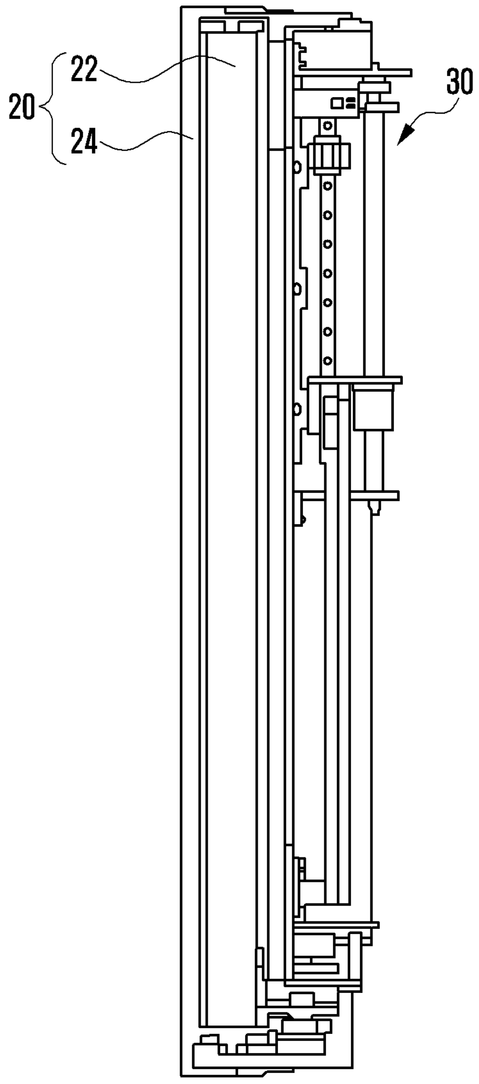
FIG. 7 illustrates a side view of a rollable display device according to an embodiment of the present invention.

FIG. 6 illustrates a front view of a rollable display device 6 with a flexible screen display 10 with one side unfolded from a rollable driving unit that is operated by a centrally positioned link driving unit according to an embodiment of the present disclosure; and FIG. 7 illustrates a side view of a rollable display device 6 according to an embodiment of the present disclosure.

Referring to FIGS. 6 and 7, when a link driving unit 30 is operated as a driving motor 40 drives, the first and second links 34*a* and 34*b*, respectively are unfolded from or folded toward the one side of the link driving unit 30.

When the flexible screen display 10 is rolled into the rollable driving units 20, the rolled screen part of the flexible screen display 10 of the rollable display device 6 increases in diameter. In this case, the flexible screen display receives force from the upper direction. In contrast, when the flexible screen display 10 is unrolled from the rollable driving unit 20, the unrolled screen part of the flexible screen display 10 of the rollable display device 6 is pulled down by gravitational force, creating a screen dropping phenomenon. In this case, the flexible screen display 10 of the rollable display device 6 is wrinkled and crumpled, and does not display a clear screen.

When the flexible screen display 10, structured to be rolled and unrolled on both sides, is repeatedly rolled or unrolled once or more times, an abnormal rolling phenomenon may occur at one or both sides, such as a case where both sides are irregularly rolled. This abnormal rolling may cause wrinkles in the flexible screen display 10 of the rollable display device 6 and a frictional phenomenon when the lower portions of the screen are input into or output from (i.e., rolled into or unrolled from) the rollable driving units 20. For example, the friction against the rollable driving units 20 may cause the flexible screen display 10 or the rollable display device 10 to be broken or damaged.

In order to resolve these problems, the rollable display device 6 employs a double cylindrical structure that separates the inner portions of the rollable driving units 20, at which the flexible screen display 10 starts to be rolled or unrolled, into a fixed part of the rollable driving units 20 and a main rolling part of the rollable driving units 20 so that the inner portions thereof can move up and down uniformly. This allows the flexible screen display 10 of the rollable display device 6 to be safely rolled or unrolled from a corresponding location.

Figure 8:
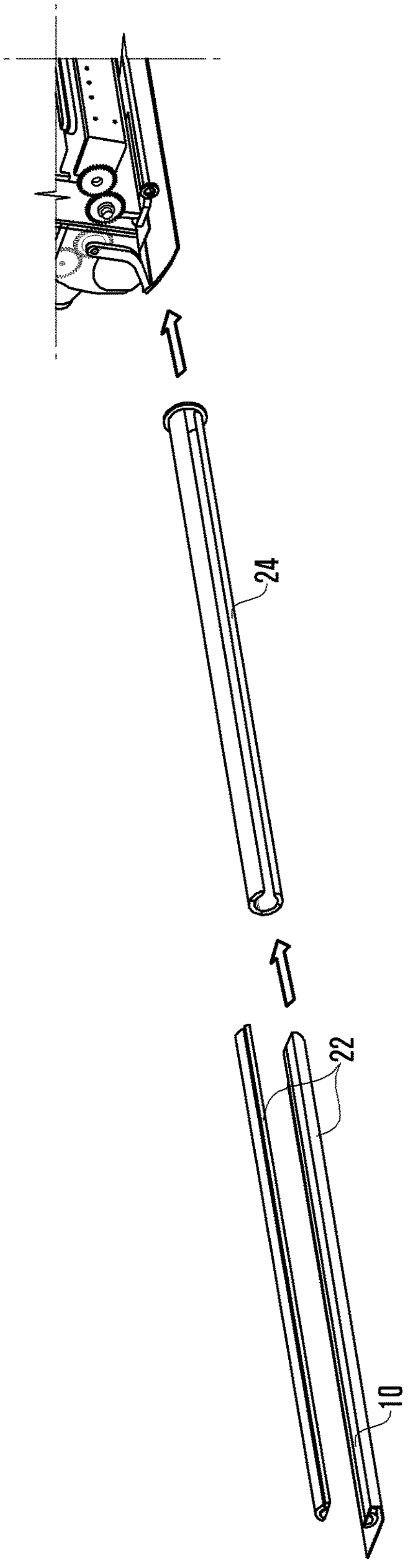
FIG. 8 is an exploded perspective view showing a pair of rollable driving units with one of the pair of rollable driving units positioned at each side of the screen display of a rollable display device according to an embodiment of the present disclosure.

FIG. 8 illustrates an exploded perspective view showing one of the rollable driving units 20 located at both ends of the flexible screen display 10 of the rollable display device 6 according to various embodiments of the present disclosure.

As shown in FIG. 8, the rollable driving unit 20 is configured to include: a rolling motor 15; an external cylindrical unit 24 which is rotatably connected to the rolling motor 15, protects an internal circuit and the flexible screen display 10, and rolls or unrolls the flexible screen display 10 according to the forward or backward rotation of the rolling motor 15; and a pair of internal cylindrical units 22 each of which is shaped to be semi-cylindrical and which hold ends of the sides of the flexible screen display 10, fix an internal circuit and input/output terminals of the flexible screen display 10, and are inserted into the external cylindrical unit 24; and a vertical movement adjusting unit for moving the external cylindrical unit 24 and internal cylindrical units 22 up and down at a preset interval and maintaining the movement and the interval.

In the embodiment, the rollable driving units 20: makes a division between the external cylindrical unit 24 and the internal cylindrical units 22; assembles a circuit board and input/output components of the rollable display device into the rolling part of the internal cylindrical units 22 thereby protecting the electric parts; moves the internal cylindrical units 22 up and down to uniformly maintain the horizontal level and the screen flatness of the flexible display unit 10, thereby preventing damage from tension; and allows the external cylindrical unit 24 to serve as a fixed unit, guiding the internal cylindrical units 22 to move up and down and lifting the internal cylindrical units 22 to the upper direction, thereby compensating the drop and allowing the screen of the rollable display device to be safely unrolled or rolled in both sides within the compensation range.

When the rollable display device 6 performs a rolling or unrolling operation, the vertical movement adjusting unit 60 moves the external cylindrical unit 24 and internal cylindrical units 22 up and down. Like a damper, the vertical movement adjusting unit 60 compensates a height difference of the flexible screen display 10 and a bottom drop of the screen created when the rollable display device 6 is unrolled or rolled, so that the flexible screen display 10 can uniformly adjust the tension in the top and bottom direction and in both sides.

Figure 9:
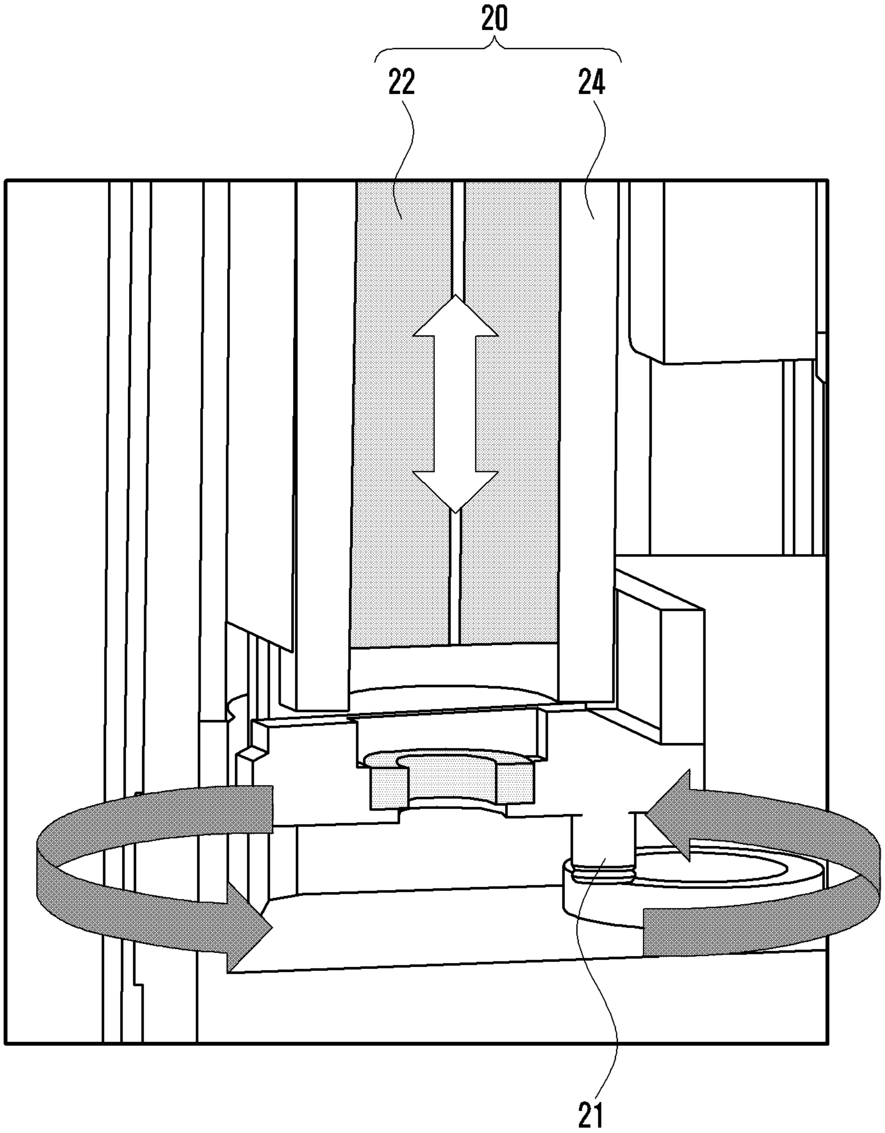
FIG. 9 is a detailed schematic illustrating a vertical movement adjusting function of a rollable driving unit of a rollable display device according to an embodiment of the present disclosure.

FIG. 9 is a schematic illustrating an operation state according to an embodiment of a vertical movement adjusting function of a rollable driving unit of FIG. 8.

Referring to FIG. 9, the external cylindrical unit 24 includes a coupling unit 21 configured to be coupled to the rotational shaft of the rolling motor 15 and a vertical movement adjusting function 60, located between the external cylindrical unit 24 and the internal cylindrical unit 22, for moving the internal cylindrical unit 22 up and down as it is rotated. When the rolling motor 15 rotates in the forward direction, the external cylindrical unit 24 is also rotated in the forward direction. In this case, the internal cylindrical unit 22 is moved up and down by the vertical movement adjusting function 60 and prevents or reduces a possibility of the flexible screen display 10 from being abnormally rolled. Therefore, any wrinkle can be prevented from forming on the flexible screen display 10 of the rollable display device 6. In addition, friction between the lower part of the flexible screen display 10 and the rollable driving units 20 is reduced or prevented from being created when the flexible screen display 10 is rolled into or unrolled from the rolling driving units 20, thereby preventing or reducing any damage that could otherwise be caused to the rollable display device 6

Figure 10:
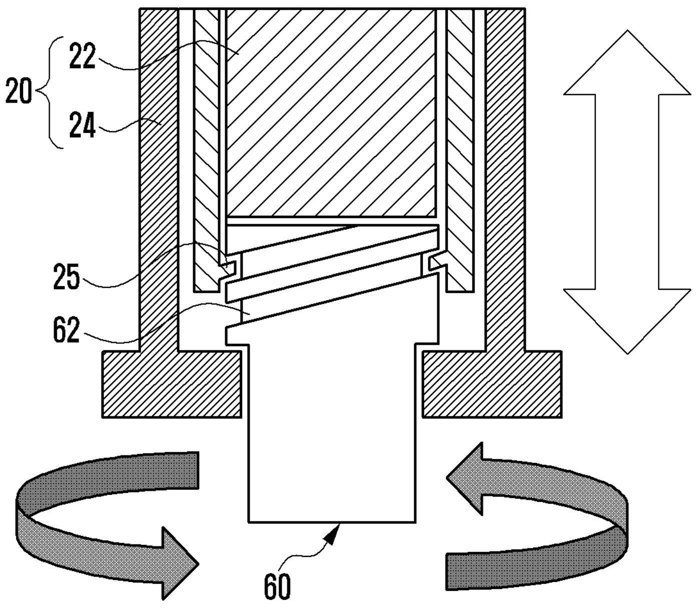
FIG. 10 is a schematic illustrating an operation of a vertical movement adjusting function of a rollable driving unit according to an embodiment of the present disclosure.
Figure 11:
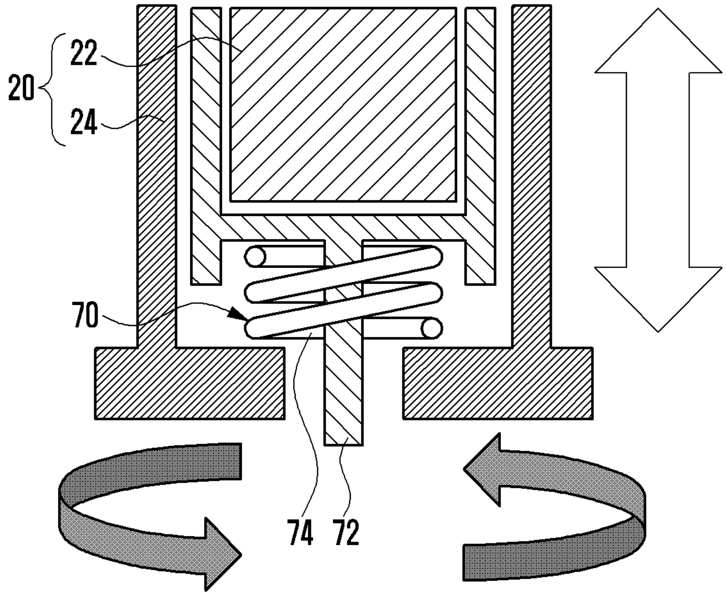
FIG. 11 is a schematic illustrating an operation of a vertical movement adjusting function of a rollable driving unit according to an embodiment of the present disclosure.
Figure 12:
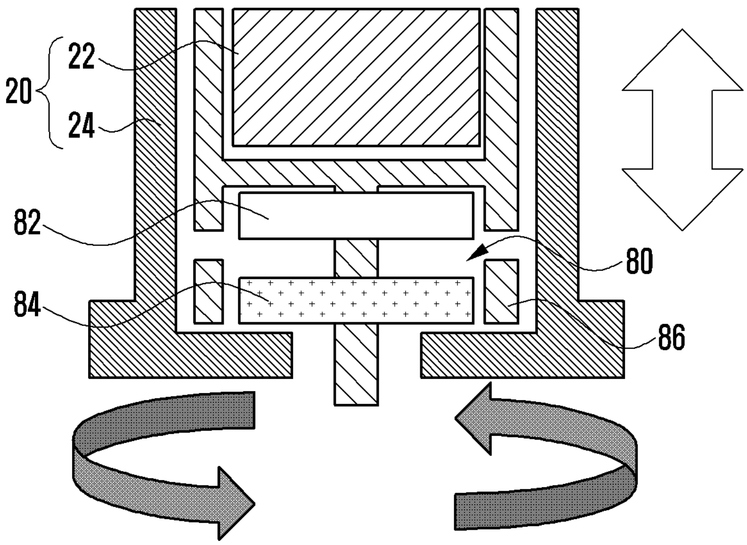
FIG. 12 is a schematic illustrating an operation of a vertical movement adjusting function of a rollable driving unit according to an embodiment of the present disclosure.

FIGS. 10 to 12 are views that describe an operation state according to various embodiment of a vertical movement adjusting function of a rollable driving unit of FIG. 8.

FIG. 10 is a schematic illustrating an operation state according to a first embodiment of a vertical movement adjusting function 60 of a rollable driving unit 20. The vertical movement adjusting unit 60 forms a helical structure on the body, which includes a thread protrusion 62 rotated according to a forward and backward rotation of the external cylindrical unit 24. The thread protrusion 62 is coupled helically with a protrusion 25 integrally formed at the lower portion of the internal cylindrical unit 22.

When the external cylindrical unit 24 is rotated in the forward or backward direction according to the forward or backward rotation of the rolling motor 15, the thread protrusion 62 is rotated and the helical coupling protrusion 25, coupled with the helical structure of the thread protrusion 62, is also rotated along the helical structure and moves up and down. That is, when the thread protrusion 62 rotates in the forward direction, since the helical coupling protrusion 25 is rotated along the helical structure and moves up, the internal cylindrical unit 22 moves up. In contrast, when the thread protrusion 62 rotates in the backward direction, since the helical coupling protrusion 25 is rotated along the helical structure and moves down, the internal cylindrical unit 22 moves down.

The rollable display device 6 according to various embodiments of the present disclosure moves up or down by an interval according to the number of rolling or unrolling rotations of the flexible screen display 10. The rollable display device 6 uses rotations based on the helical structure. To this end, the helical structure is designed to have a corresponding pitch, so that the rollable display device 6 can uniformly adjust the location of the flexible screen display 10.

FIG. 11 illustrates an operation state according to a second embodiment of a vertical movement adjusting function 60 of a rollable driving device 6. The vertical movement adjusting unit 70 is configured to include a protrusion 72 formed at the lower center of an internal cylindrical unit 22, and an elastic spring 74 inserted into the protrusion 72.

The rollable display device 6 according to various embodiments of the present disclosure moves up or down by an interval according to the number of rolling or unrolling rotations of the flexible screen display 10. When the external cylindrical unit 24 rotates in the forward or backward direction according to forward or backward rotation of the rolling motor 15, the internal cylindrical unit 22 may be dropped by gravity. In order to compensate for the drop, the rollable display device 6 employs the elastic spring 74 of a certain magnitude of elasticity and thus uniformly adjusts the location of the flexible screen display 10.

FIG. 12 illustrates an operation state according to a third embodiment of a vertical movement adjusting function 60 of a rollable driving unit 6. The vertical movement adjusting unit 80 is configured to include first and second electromagnets 82 and 84, installed between the external cylindrical unit 24 and the internal cylindrical unit 22, so that their polarities are opposite each other; and a sensor 86 for detecting an interval between the external cylindrical unit 24 and the internal cylindrical unit 22 according to the screen position change of the flexible screen display 10.

Although the embodiment of FIG. 12 is described in such a way that the first electromagnet 82 produces magnetic fields of N pole and the second electromagnet 84 produces magnetic fields of S pole, it should be understood that the first and second electromagnets 82 and 84 may also produce magnetic fields of their opposite polarities to the embodiment depicted according to the control of the controller 50.

When the rollable display device 6 according to various embodiments of the present disclosure moves up or down by an interval according to the number of rolling or unrolling rotations of the flexible screen display 10 of the rollable display device 6, the screen position of the flexible screen display 10 varies. The variation of the screen position of the flexible screen display 10 causes a change in the interval between the external cylindrical unit 24 and the internal cylindrical unit 22. The sensor 86 detects the change in the interval and transmits the detected signal to the controller 50. The controller 50 controls, based on the detected signal, the first and second electromagnets 82 and 84 to change their poles. Therefore, the controller 50 controls the interval between the external cylindrical unit 24 and the internal cylindrical unit 22 to be constant.

When the interval between the external cylindrical unit 24 and the internal cylindrical unit 22 is less than a preset value, the controller 50 controls the first and second electromagnets 82 and 84 to produce the same pole, thereby increasing the interval between the external cylindrical unit 24 and the internal cylindrical unit 22. In contrast, when the interval between the external cylindrical unit 24 and the internal cylindrical unit 22 is greater than a preset value, the controller 50 controls the first and second electromagnets 82 and 84 to produce the different poles, thereby decreasing the interval between the external cylindrical unit 24 and the internal cylindrical unit 22.

According to various embodiments of the present disclosure, the rollable display device 6 is capable of performing electric control to maintain the interval between the external cylindrical unit 24 and the internal cylindrical unit 22, constantly, according to the screen position change of the flexible screen display 10, and thus efficiently adjusting the vertical movement of the rollable display device 6.

The rollable display device 6 is configured to uniformly maintain the flatness of a large-sized flexible screen display 10 when it is rolled or unrolled on both sides, and thus provides a high quality screen without wrinkles and crumbles.

The rollable display device 6 is configured to withstand a constant gap in an interval when the flexible screen display 10 is unrolled, thereby preventing or reducing a possibility of frictional screen damage.

The rollable display device 6 is configured to roll the flexible screen display 10 to a minimum radius, for example when the rollable display device 6 is in a folded position, and unroll it to a maximum size, for example when the rollable display device 6 is in a fully unfolded position, smoothly, with high-quality, thereby increasing the completion level of product.

Although the present disclosure has been described with exemplary embodiments, various changes and modifications may be suggested to one skilled in the art. It is intended that the present disclosure encompass such changes and modifications as fall within the scope of the appended claims.

What is claimed is:

1. A rollable display device comprising:

a flexible screen display configured to be rolled or unrolled on both sides;

at least one rollable driving unit, each of the at least one rollable driving unit positioned at opposite sides of the flexible screen display and wherein each side of the flexible screen display is rolled into and unrolled from each of the at least one rollable driving unit associated therewith;

a link driving unit configured to support the at least one rollable driving unit to roll or unroll the sides of the flexible screen display; and a controller configured to control operation of the at least one rollable driving unit and the link driving unit, wherein the link driving unit comprises:

a support vertically installed to the flexible screen display;

first and second links which are folded into and unfolded from both sides of the support; and a driving motor attached to the support and producing a torque to fold or unfold the first and second links.

2. The rollable display device of claim 1, wherein:

the first and second links are folded or unfolded with respect to hinges; and wherein each of the first and second links comprises a fixed end affixed to a lower portion of the each of the at least one rollable driving unit, and a free end movably coupled to an upper portion of the each of the at least one rollable driving unit.

3. The rollable display device of claim 1, wherein the first and second links are configured such that one end of each of the first and second links is fixed to a lower portion of the support and an other end of the each of the first and second links moves up and down along a screw bar attached to an upper portion of the support.

4. The rollable display device of claim 3, wherein:

the driving motor is configured to rotate the screw bar in a forward or backward direction; and the one end of the each of the first and second links moves up and down along the screw bar and the each of the first and second links is folded.

5. The rollable display device of claim 1, wherein the each of the at least one rollable driving unit comprises a double cylindrical structure.

6. The rollable display device of claim 1, wherein the each of the at least one rollable driving unit is configured to maintain a horizontal level and a screen flatness of the flexible screen display.

7. The rollable display device of claim 1, wherein each of the at least one rollable driving unit comprises a double cylindrical structure.

8. A rollable display device comprising:

a flexible screen display configured to be rolled or unrolled on both sides;

at least one rollable driving unit, each of the at least one rollable driving unit comprising a double cylindrical structure and positioned at opposite sides of the flexible screen display, and wherein each side of the flexible screen display is rolled into and unrolled from each of the at least one rollable driving unit associated therewith;

a link driving unit configured to support the at least one rollable driving unit to roll or unroll the sides of the flexible screen display; and a controller configured to control operation of the at least one rollable driving unit and the link driving unit, wherein the each of the at least one rollable driving unit comprises:

a rolling motor;

an external cylindrical unit rotatably connected to the rolling motor and configured for rolling or unrolling the flexible screen display;

a pair of internal cylindrical units inserted into the external cylindrical unit and configured to hold ends of the sides of the flexible screen display; and a vertical movement adjusting unit configured to move the external cylindrical unit and internal cylindrical units up and down at a constant interval and maintain the movement and the constant interval.

9. The rollable display device of claim 8, wherein the vertical movement adjusting unit comprises:

a thread protrusion on which a helical structure is formed and configured to rotate according to a rotation of the external cylindrical unit; and a second protrusion integrally formed at a lower portion of the each of the pair of internal cylindrical units; and wherein the thread protrusion is coupled helically with the second protrusion.

10. The rollable display device of claim 8, wherein the vertical movement adjusting unit comprises:

a protrusion formed at a lower portion of the each of the pair of internal cylindrical units; and an elastic spring inserted into the protrusion.

11. The rollable display device of claim 8, wherein the vertical movement adjusting unit comprises:

first and second electromagnets installed between the each of the pair of internal cylindrical units and the external cylindrical unit; and a sensor configured to an interval between the external cylindrical unit and the each of the pair of internal cylindrical units according to a screen position change of the flexible screen display.

12. The rollable display device of claim 11, wherein the controller is configured to control, based on a detected signal from the sensor, the first and second electromagnets.

13. The rollable display device of claim 12, wherein the controller is configured to change a pole of at least one of the first and second electromagnets based on the detected signal.

14. The rollable display device of claim 13, wherein the controller is configured to control the interval between the external cylindrical unit and the each of the pair of internal cylindrical units based on the detected signal.

15. The rollable display device of claim 8, wherein:

the vertical movement adjusting unit is configured to reduce a possibility of friction being created between a lower portion of the flexible screen display and the each of the at least one rollable driving unit when the flexible screen display is rolled into or unrolled from the each of the at least one rollable driving unit.

* * * * *